(12) United States Patent
Mouri et al.

(10) Patent No.: US 6,975,026 B2
(45) Date of Patent: Dec. 13, 2005

(54) PACKAGE FOR MOUNTING SEMICONDUCTOR DEVICE

(75) Inventors: Morihiko Mouri, Tokyo (JP); Sadayuki Okuma, Tokyo (JP); Yasushi Takahashi, Tokyo (JP); Takao Ono, Tokyo (JP); Yosihiro Sakaguchi, Tokyo (JP); Atsushi Nakamura, Tokyo (JP); Toshio Miyazawa, Tokyo (JP)

(73) Assignees: Elpida Memory, Inc., Tokyo (JP); Renesas Eastern Japan Semiconductor, Inc., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/409,929

(22) Filed: Apr. 10, 2003

(65) Prior Publication Data

US 2004/0007383 A1     Jan. 15, 2004

(30) Foreign Application Priority Data

Apr. 10, 2002   (JP) .............................. 2002-107452

(51) Int. Cl.[7] .............................................. H01L 23/10
(52) U.S. Cl. ..................... 257/706; 438/106; 438/127; 438/122; 257/706
(58) Field of Search ................................ 438/127, 106; 257/787

(56) References Cited

U.S. PATENT DOCUMENTS

| | | | | |
|---|---|---|---|---|
| 4,489,241 A | * | 12/1984 | Matsuda et al. | 250/491.1 |
| 4,716,396 A | * | 12/1987 | Kneifel | 338/226 |
| 4,849,857 A | * | 7/1989 | Butt et al. | 361/708 |
| 5,276,586 A | * | 1/1994 | Hatsuda et al. | 361/705 |
| 5,285,350 A | * | 2/1994 | Villaume | 361/690 |
| 5,510,956 A | * | 4/1996 | Suzuki | 361/704 |
| 5,650,918 A | * | 7/1997 | Suzuki | 361/760 |
| 5,777,847 A | * | 7/1998 | Tokuno et al. | 361/705 |
| 5,831,836 A | * | 11/1998 | Long et al. | 361/820 |
| 5,854,511 A | * | 12/1998 | Shin et al. | 257/713 |
| 5,891,753 A | * | 4/1999 | Akram | 438/108 |
| 5,905,299 A | * | 5/1999 | Lacap | 257/666 |
| 6,215,180 B1 | * | 4/2001 | Chen et al. | 257/720 |
| 6,285,079 B1 | * | 9/2001 | Kunikiyo | 257/737 |
| 6,288,900 B1 | * | 9/2001 | Johnson et al. | 361/705 |
| 6,547,076 B1 | * | 4/2003 | Pylant | 206/713 |
| 6,661,661 B2 | * | 12/2003 | Gaynes et al. | 361/705 |

FOREIGN PATENT DOCUMENTS

| | | |
|---|---|---|
| JP | 4-206858 | 7/1992 |
| JP | 8-17951 | 1/1996 |
| JP | 11-67998 | 3/1999 |
| JP | 2000-91474 | 3/2000 |
| JP | 2001-57402 | 2/2001 |
| JP | 2001-68512 | 3/2001 |

OTHER PUBLICATIONS

Korean Office Action dated Mar. 30, 2005.

* cited by examiner

*Primary Examiner*—Thao P. Le
(74) *Attorney, Agent, or Firm*—Katten Muchin Rosenman LLP

(57) ABSTRACT

A package for mounting a semiconductor device has a surface exposed to an atmosphere. The exposed surface is covered with a covering material such as a paint, a tape or a seal.

11 Claims, 4 Drawing Sheets

PACKAGE FOR MOUNTING SEMICONDUCTOR DEVICE

This application claims priority to prior application JP2002-107452, the disclosure of which is incorporated herein by reference.

BACKGROUND OF THE INVENTION

The present invention relates to a package for mounting a semiconductor device having an exposed surface, in particular relates to a package for mounting a semiconductor device suitable for a tape carrier package (TCP) or a chip size package (CSP).

Referring to FIG. 1, description will be made of a related tape carrier package (TCP).

In FIG. 1, a tape carrier package 60 has a resin 61, press-bonded portions 62, a lead 63 and a tape 64, and an LSI 65 is mounted on this tape carrier package 60.

Subsequently, an assembling method of the tape carrier package 60 will be described with reference to FIG. 2.

First, a wafer is provided (step 701), and a rear (back) surface of the wafer is polished (step 702).

Next, the polished wafer is diced (step 703), and is then assembled (step 704). Finally, desired marking is applied to the LSI 65 (step 705).

In the tape carrier package 60 thus assembled, an exposed surface 66 of the LSI 65 (refer to FIG. 1) is formed with a mirror finish. Therefore, its thermal emissivity is low.

Since the thermal emissivity of the exposed surface 66 of the LSI 65 is low as mentioned above, the temperature inside the LSI 65 is easily increased. This is because the exposed surface 66 is a mirror surface and has high thermal reflectivity, that is, the thermal emissivity becomes low and heat release properties are degraded.

Specifically, as shown in FIG. 3, in the case of a related mirror finish process, thermal reflectivity=0.9 results in thermal absorptivity=thermal emissivity=0.1. As a consequence, the major part of heat reaching the exposed surface 66 from the inside of the LSI 65 is reflected. In other words, the proportion of thermal reflection is much higher than that of thermal emission. This causes the deterioration of heat release properties (heat-dissipating properties) of the LSI.

SUMMARY OF THE INVENTION

It is therefore an object of the present invention to provide a package for mounting a semiconductor device which is capable of improving heat release properties (heat-dissipating properties) of an LSI.

According to the present invention, a package for mounting a semiconductor device has a surface exposed to an atmosphere. Herein, at least part of the exposed surface is covered with a covering material.

Preferably, the covering material covers the entire of the exposed surface. For example, the exposed surface is mirror finished.

Here, the covering material is a paint, for example. In this case, when the thermal conductivity of the paint is substantially 0.1, the thickness of the paint is set to be less than 4.5 μm.

Furthermore, the covering material may be a tape or seal.

Still further, the package is a tape carrier package or chip size package, for example.

The covering material desirably has a thermal emissivity of 0.8 or more.

In addition, the covering material may cover only part of the exposed surface, and the rest of the exposed surface may constitute a mark portion.

DESCRIPTION OF THE PREFERRED EMBODIMENTS

Embodiments of the present invention will hereinafter be described in detail in reference to the drawings.

(First Embodiment)

Figure 4:
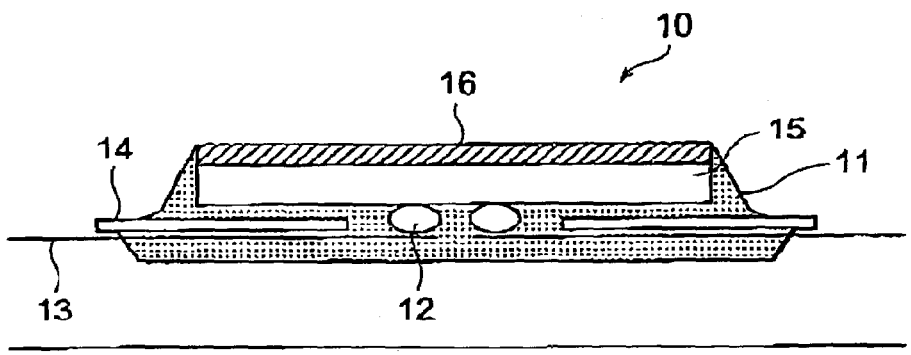
FIG. 4 is a sectional view showing a package for mounting a semiconductor device (tape carrier package) according to a first embodiment of the present invention.

Referring to FIG. 4, description will be made of a package for mounting a semiconductor device according to the present invention, taking an example of a tape carrier package (TCP). Herein, it is to be noted that the package according to the present invention is not limited to the tape carrier package (TCP), and is applicable to other various packages such as a chip size package (CSP).

In FIG. 4, a tape carrier package 10 has a resin 11, press-bonded portions 12, a lead 13 and a tape 14, and an LSI 15 is mounted on this tape carrier package 10. With such a structure, a mirror-finished exposed surface of the LSI 15 is covered with a covering material 16.

For the tape carrier package (TCP) 10 in which the material having a low thermal emissivity to an atmosphere is exposed, the entire exposed surface of the LSI 15 is covered with a material having high thermal emissivity, for example, a paint, a tape or a seal having a thermal emissivity of 0.8 or more. In FIG. 4, the covering material 16 covers the entire exposed surface of the LSI 15, but may cover part of the exposed surface as described later.

In this event, although the covering thickness of the covering material 16 changes depending upon the thermal conductivity, the thickness is thinly set within the range less than 4.5 μm, for example, in the case where the paint has a thermal conductivity of 0.1 [W/m·K].

Figure 5:
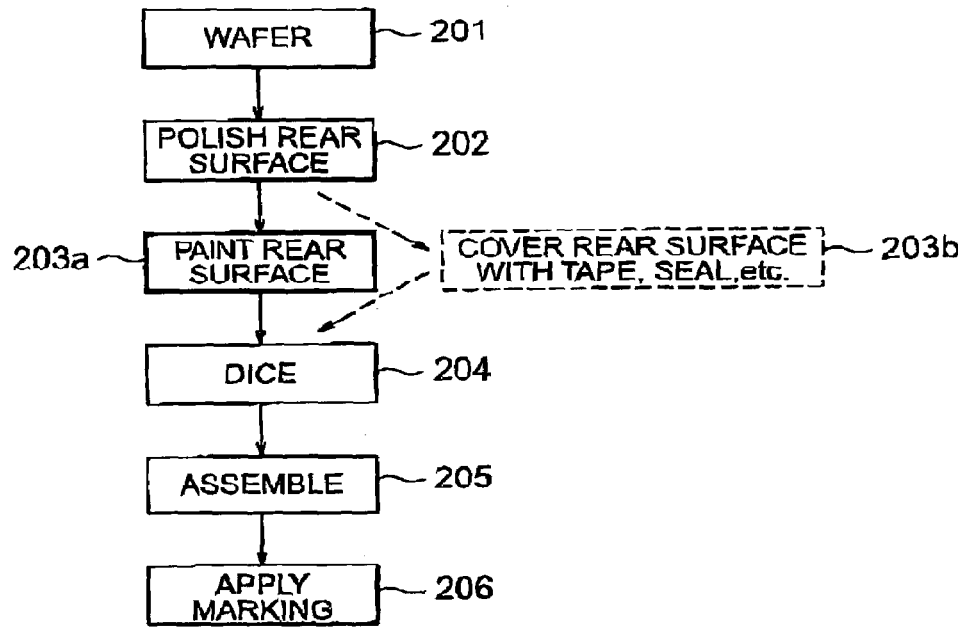
FIG. 5 is a flowchart illustrating an a method of assembling the package for mounting the semiconductor device (tape carrier package) according to the first embodiment of the present invention.

Among various covering methods, such a method is conceivable that, for example, after a rear (back) surface is polished, a paint is applied to the entire rear surface, or a tape or a seal is affixed thereto, and then by way of a dicing process, assembling is completed. This assembling method of the tape carrier package 10 will be described with reference to FIG. 5.

First, a wafer is prepared (step 201), and the rear surface of the wafer is polished (step 202).

Successively, after the rear surface is polished, a paint is applied to the entire rear surface (step 203*a*). Alternatively, a tape or a seal is affixed thereto (step 203*b*).

Thereafter, the wafer is diced (step 204), and is then assembled (step 205). Finally, desired marking is applied to the LSI 15 (step 205).

Figure 1:
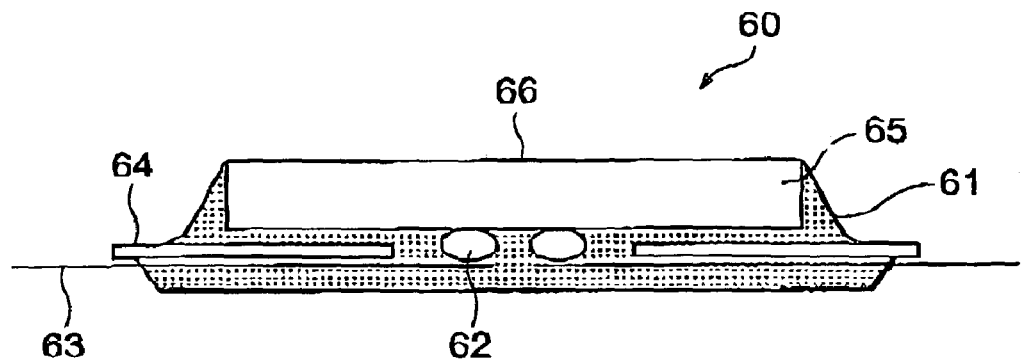
FIG. 1 is a sectional view showing a related tape carrier package.
Figure 2:
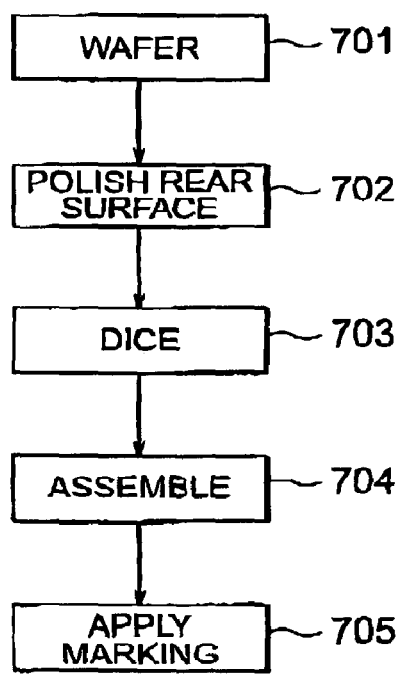
FIG. 2 is a flowchart illustrating a method of assembling the related tape carrier package.

The advantage of this assembling method is that it is possible to efficiently cover a large number of LSIs 65 at the same time. It is noted here that the LSI is usually assembled by way of a rear surface polishing step in a state of a wafer and then a dicing step (refer to FIG. 2).

By covering the exposed surface through application of a paint, or through a tape or a seal, the heat release properties of the LSI 15 are increased to thereby lower the temperature.

Generally, when heat (electromagnetic wave) is incident on a surface of a material (substance), part of energy is reflected and the rest is absorbed. This proportion is referred to as thermal reflectivity and thermal absorptivity, respectively, and reflectivity+absorptivity=1 (in the case of an opaque body). In addition, the proportion of heat radiated from a substance is referred to as thermal emissivity, and it is found out that thermal emissivity= thermal absorptivity (Kirchhoff's law).

Figure 3:
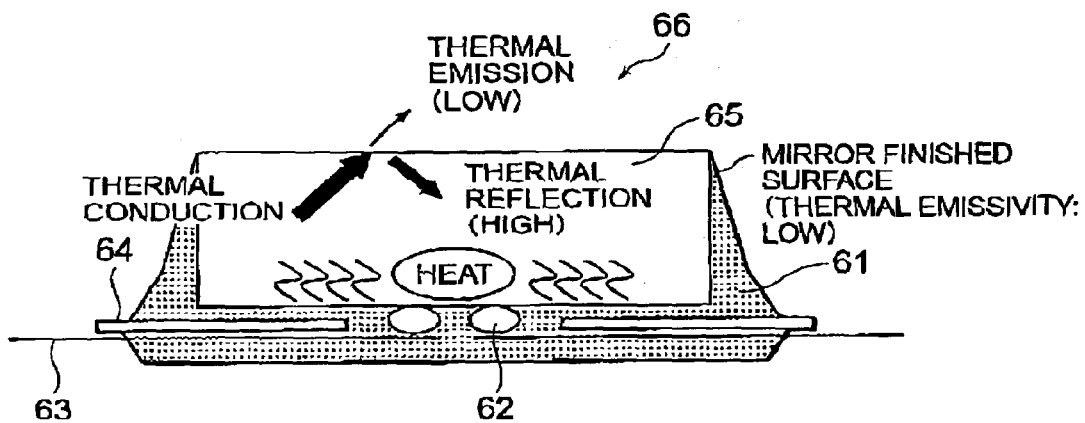
FIG. 3 is a sectional view showing a related thermal conduction model.

As described above, in the case of the existing mirror finish, thermal reflectivity=0.9 results in thermal absorptivity=thermal emissivity=0.1. Consequently, the major part of heat reaching the exposed surface from the inside of the LSI chip is reflected (refer to FIG. 3).

Figure 6:
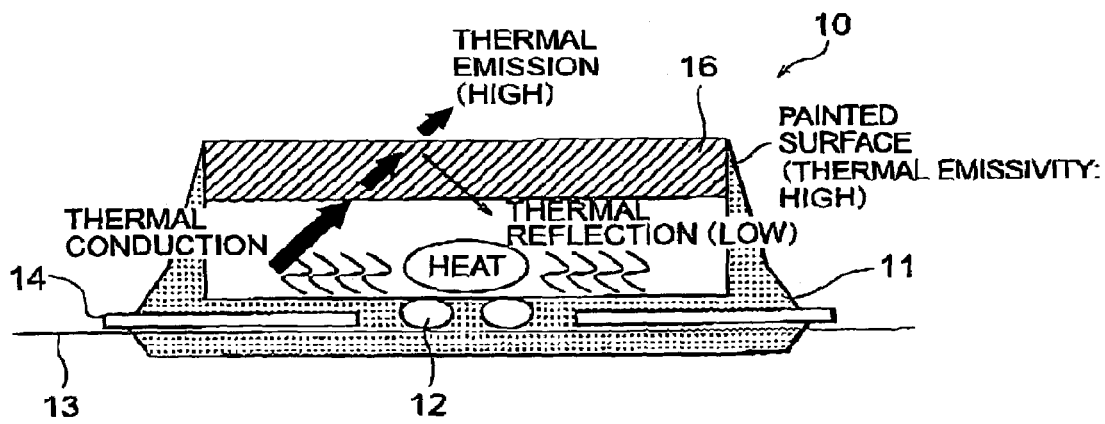
FIG. 6 is a sectional view showing a thermal conduction model of the present invention.

Therefore, in the present invention, as shown in FIG. 6, the LSI 15 is covered with a material (substance) of thermal emissivity=0.8. Thereby, much heat is emitted from the exposed surface to obtain a heat release effect. In other words, contrary to the related art shown in FIG. 3, the proportion of thermal emission is higher than that of thermal reflectivity.

Herein, an adverse effect of rear surface painting is the increase of thermal resistance. Depending upon the kind of paint, for example, a thermal conductivity of 0.1 [W/m·K] of a paint is 1000 times as high as or higher than that of 170 [W/m·K] of Si, resulting in higher thermal resistance.

When the chip thickness is 300 [$\mu$m] and the area of the exposed surface is 80.5 [mm$^2$] without a paint, the thermal resistance is 300 [$\mu$m]/ 80.5 [mm$^2$]·1/170 [W/m·K]=21.9 [mK/W].

When the paint thickness is 4.5 [$\mu$m], the thermal resistance is 21.9 [mk/W] for Si+4.5 [$\mu$m]/80.5 [mm$^2$]·1/0.1 [W/m·K] for the paint=580.9 [mK/W], which is 25 times as high or higher.

However, it is assumed that a heat amount (a calorie) of 100 W is generated and the surface temperature is increased to 100 [K]. Under this circumstance, the temperature differences between a heat generating portion and the surface are 2.2 [K] (without paint) and 58.1 [K] (with paint), respectively. Given that the outside air is 0 [K], the surface temperature is decreased to 80 [K] and 20 [K], respectively, due to the thermal emissivity. As a result, the temperature of the heat generating portion are 82.2 [K] and 78.1 [K], respectively, due to the above-mentioned temperature differences, resulting in better heat release properties when the paint is provided.

(Second Embodiment)

Figure 7:
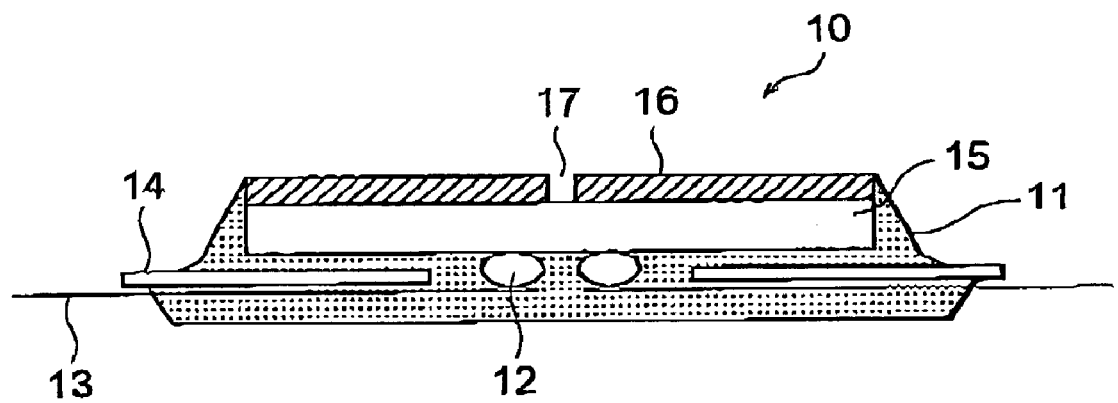
FIG. 7 is a sectional view showing the package for mounting the semiconductor device (tape carrier package) according to a second embodiment of the present invention.
Figure 8:
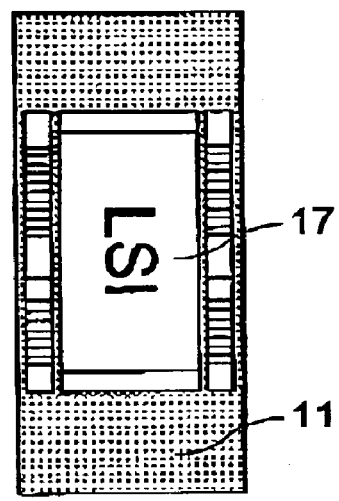
FIG. 8 is a plan view showing the package for mounting the semiconductor device (tape carrier package) according to the second embodiment of the present invention.

Referring to FIGS. 7 and 8, description will be made of a package for mounting a semiconductor device according to a second embodiment of the present invention, taking an example of the tape carrier package (TCP).

In the second embodiment, a part of the exposed surface of the LSI 15, which is mirror-finished, is covered with the covering material 16, and it is different in this point from the package for mounting the semiconductor device in the first embodiment (FIG. 4). The constitution of other parts is the same as that of the package for mounting the semiconductor device shown in FIG. 4 and will not be described.

Specifically, a paint or the like is applied in a manner to outline a mark portion 17 such as a product name (characters or symbols). In this method, while a part where the thermal emissivity is low remains, application to the mark portion 17 and application of a paint can be performed together, thus providing a merit of preventing the number of processes from being increased.

According to the present invention, it is possible to provide a package for mounting a semiconductor device capable of improving the heat release properties of the LSI.

While the present invention has thus far been disclosed in conjunction with several embodiments thereof, it will be readily possible for those skilled in the art to put the present invention into practice in various other manners.

What is claimed is:

1. A package for mounting a semiconductor device having a surface exposed to an atmosphere, wherein:
   at least part of the surface exposed to the atmosphere is covered with a covering material having higher thermal emissivity than a material of said exposed surface and being selected from the group consisting of a paint, a tape and a seal, the covering material contacting said at least part of the surface exposed to the atmosphere.

2. The package for mounting the semiconductor device according to claim 1, wherein:
   the covering material covers an entire of the exposed surface.

3. The package for mounting the semiconductor device according to claim 1, wherein:
   the exposed surface is mirror finished.

4. The package for mounting the semiconductor device according to claim 1, wherein:
   the covering material is a paint.

5. A package for mounting a semiconductor device having a surface exposed to an atmosphere, wherein:
   at least part of the exposed surface is covered with a covering material,
   the covering material is a paint, and
   the covering material contacts said at least part of the exposed surface,
   when a thermal conductivity of the paint is substantially 0.1, a thickness of the paint is set to be less than 4.5 $\mu$m.

6. The package for mounting the semiconductor device according to claim 1, wherein:
   the covering material is a tape.

7. The package for mounting the semiconductor device according to claim 1, wherein:
   the covering material is a seal.

8. The package for mounting the semiconductor device according to claim 1, wherein:
   the package is a tape carrier package.

9. The package for mounting the semiconductor device according to claim 1, wherein:
   the package is a chip size package.

10. A package for mounting a semiconductor device having a surface exposed to an atmosphere, wherein:
   at least part of the exposed surface is covered with a covering material, the covering material contacting said at least part of the exposed surface, and
   the covering material has a thermal emissivity of 0.8 or more.

11. The package for mounting the semiconductor device according to claim 1, wherein:
   the covering material covers only part of the exposed surface, and
   a rest of the exposed surface constitutes a mark portion.

* * * * *